United States Patent [19]

Patel et al.

[11] Patent Number: 5,742,077
[45] Date of Patent: Apr. 21, 1998

[54] SEMICONDUCTOR DEVICE

[75] Inventors: N. K. Patel; I. S. Millard, both of Cambridge, United Kingdom

[73] Assignee: Kabushiki Kaisha Toshiba, Kawasaki, Japan

[21] Appl. No.: 689,137

[22] Filed: Jul. 30, 1996

[30] Foreign Application Priority Data

Jul. 31, 1995 [GB] United Kingdom ............... 9515681

[51] Int. Cl.$^6$ ............................................. H01L 29/778
[52] U.S. Cl. ............................................. 257/194; 257/192
[58] Field of Search ............................... 257/192, 194, 257/195, 24; 438/172

[56] References Cited

U.S. PATENT DOCUMENTS 5,142,349  8/1992  Zhu et al. ............................. 257/192
5,332,911  7/1994  von Klitzing et al. .............. 257/194
5,561,305  10/1996  Smith ................................... 257/194

FOREIGN PATENT DOCUMENTS 2 284 929  6/1995  United Kingdom.

*Primary Examiner*—Jerome Jackson
*Assistant Examiner*—John Guay
*Attorney, Agent, or Firm*—Oblon, Spivak, McClelland, Maier & Neustadt, P.C.

[57] ABSTRACT

A semiconductor device comprises a heterostructure which includes first and second mutually separated conductive layers, e.g., active layers in which a respective two-dimensional electron gas can be induced. A source region and drain region each contact both conductive layers. A gate electrode is disposed between the source and drain regions. First and second output contact regions each contact both conductive layers. The first and second output contact regions are positioned between the source and drain and are overlapped by the gate electrode.

32 Claims, 2 Drawing Sheets

SEMICONDUCTOR DEVICE

BACKGROUND OF THE INVENTION

1. Field of the Invention

The present invention relates to a semiconductor device comprising a pair of mutually separated layers in each of which a two-dimensional electron gas (2DEG) can be induced, and an operating method thereof.

2. Description of the Related Art

UK Patent Specification GB-A-2 248 929 discloses a structure in which one of a pair of mutually separated 2DEGs is isolated by depleting-out a region thereof using a secondary gate electrode. In this case, the conducting layers are further apart and the resonant tunneling process is not significant. When carrier densities in each 2DEG are equalized by means of a primary gate electrode, carriers can be transferred between the isolated 2DEG and the non-isolated 2DEG by a tunneling process. Thus, when tunneling occurs, the carriers in the isolated 2DEG contribute to transconductance.

SUMMARY OF THE INVENTION

The present invention has arisen from an observation made during four terminal measurements made on a device similar to that of the aforementioned kind. An object of the present invention is to provide a semiconductor device and an operating method of obtaining a non-linear voltage output in response to a voltage applied to a surface Schottky gate.

A four terminal resistance measurement is considered to be independent of any contact resistances. The present invention derives from a phenomenon whereby a non-linearity, in the form of a negative transconductance region has been observed in the apparent resistance between two voltage probes in a device having two mutually separated 2DEGs. This provides the opportunity of using the contacts to such voltage probes as "output terminals".

Thus, the present invention provides a semiconductor device comprising a heterostructure which includes first and second mutually separated conductive layers, source and drain regions being provided, each contacting both of said first and second conductive layers, a gate electrode being disposed over the first and second conductive layers, between the source and drain regions, and first and second output contact regions being provided, each contacting both of said first and second conductive layers, the first and second output contact regions being positioned between the source and drain regions and each being overlapped by the gate electrode.

The nonlinearity observed in the device according to the present invention allows it to be used in a number of applications, for example as a switch, a voltage amplifier or as a frequency multiplier. The nonlinearity can be altered by changing the sample geometry, e.g., decreasing the spacing between the output contact regions or increasing their length.

Preferably, each of the first and second conductive layers is an active layer in which a two-dimensional electron gas can be induced.

For the avoidance of doubt, in the active layers, the majority carriers can be electrons or holes. However, the term conventional in the art, i.e., "two-dimensional electron gas" or "2DEG" will be used in both the description and claims, to over either possibility, unless specifically indicated to the contrary. However, in the context of the present invention, any conducting layers may be used.

In a preferred embodiment described hereinbelow, the gate electrode is positioned directly between the source and drain regions and respective contact electrodes for the first and second output contact regions are positioned beside the path between source region, gate electrode and drain region.

The conductive layers may be separated by one or more barrier layers, or even a superlattice. Carriers may be derived from any appropriate source thereof, for example a doped layer disposed above an upper one of the conductive layers and/or below a lower one of the conductive layers.

In use, the device is operated by applying a voltage between the source and drain regions which result in an output voltage across the first and second output contact regions. A second variable voltage applied to the gate electrode can then be used to control the output voltage.

BRIEF DESCRIPTION OF THE DRAWINGS

The present invention will now be explained in more detail by way of the following non-limiting description of a preferred embodiment and with reference to the accompanying drawings in which.

DETAILED DESCRIPTION OF THE PREFERRED EMBODIMENTS

Figure 1:
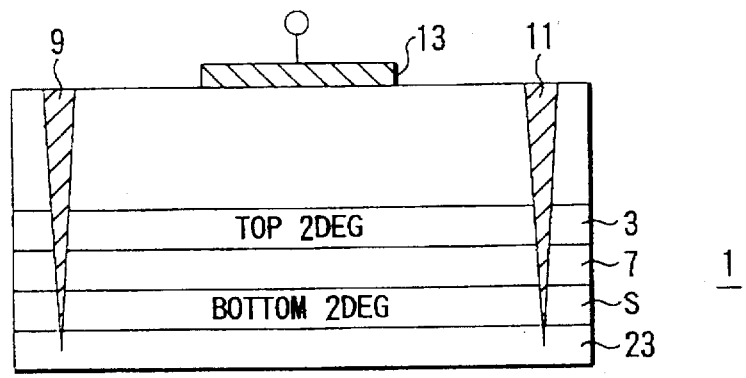
FIG. 1 shows a cross-section through a semiconductor device according to the present invention.
Figure 2:
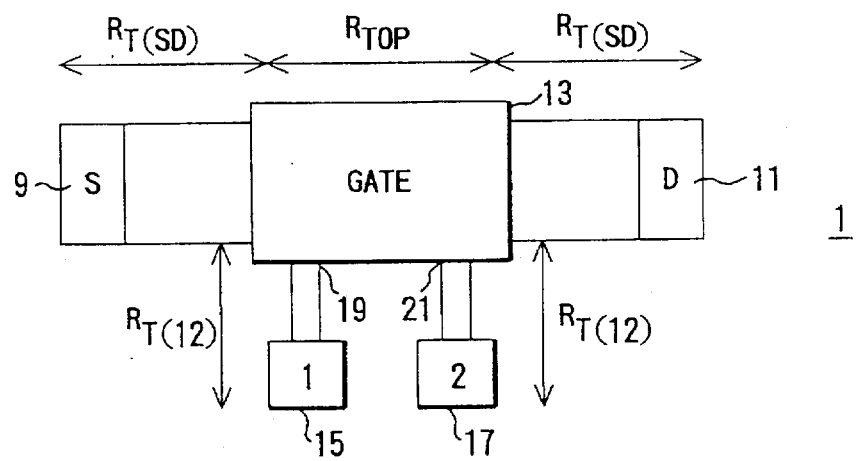
FIG. 2 shows a plan view of the semiconductor device shown in FIG. 1.

Referring to FIGS. 1 and 2, there is shown a device 1 according to the present invention. The device comprises an upper active or quantum well layer (conductive layer) 3 and a lower active or quantum well layer (conductive layer) 5, separated by a barrier layer 7. A source deep ohmic contact (source region) 9 and a drain deep ohmic contact (drain region) 11, each contact both the upper and lower quantum well layers 3, 5. Respective contact electrodes (not shown) are each provide on top of the deep ohmic contact regions 9, 11.

A gate electrode 13 is disposed above the structure between the source region 9 and drain region 11. Referring now specifically to FIG. 2, a first probe-type ohmic contact 15 and a second probe-type ohmic contact 17 are spaced apart from one another, beside the gate electrode 13 but spaced apart therefrom. Respective contact electrodes (not shown) are also each provided on top of the probe-type ohmic contacts 15, 17. Along a path from the source region 9 to the drain region 11, in one direction, the gate electrode extends to beyond a point 19 opposite the first probe-type ohmic contact 15. In the opposite direction, the gate electrode extends to beyond a point 21 opposite the second probe-type ohmic contact 17.

Thus, the gate electrode 13 may be considered to overlap the first and second probe-type ohmic contacts. However, the gate electrode 13 does not actually overlap these electrical contacts per se. Nevertheless, the ohmic contact regions are in electrical contact with the quantum well layers 3, 5 at corresponding positions underneath the gate electrode, i.e., spaced-apart positions along the source-drain path.

The aforementioned structure is produced as modulation doped GaAs/AlGaAs structures grown upon a (100) orientated GaAs substrate 23 using molecular beam epitaxial growth (MBE). The quantum wells have 110 Å width and separated by the 300 Å thick barrier layer 7. Carriers are supplied by 400 Å silicon doped layers (not shown) 300 Å above and below the quantum wells.

Figure 3:
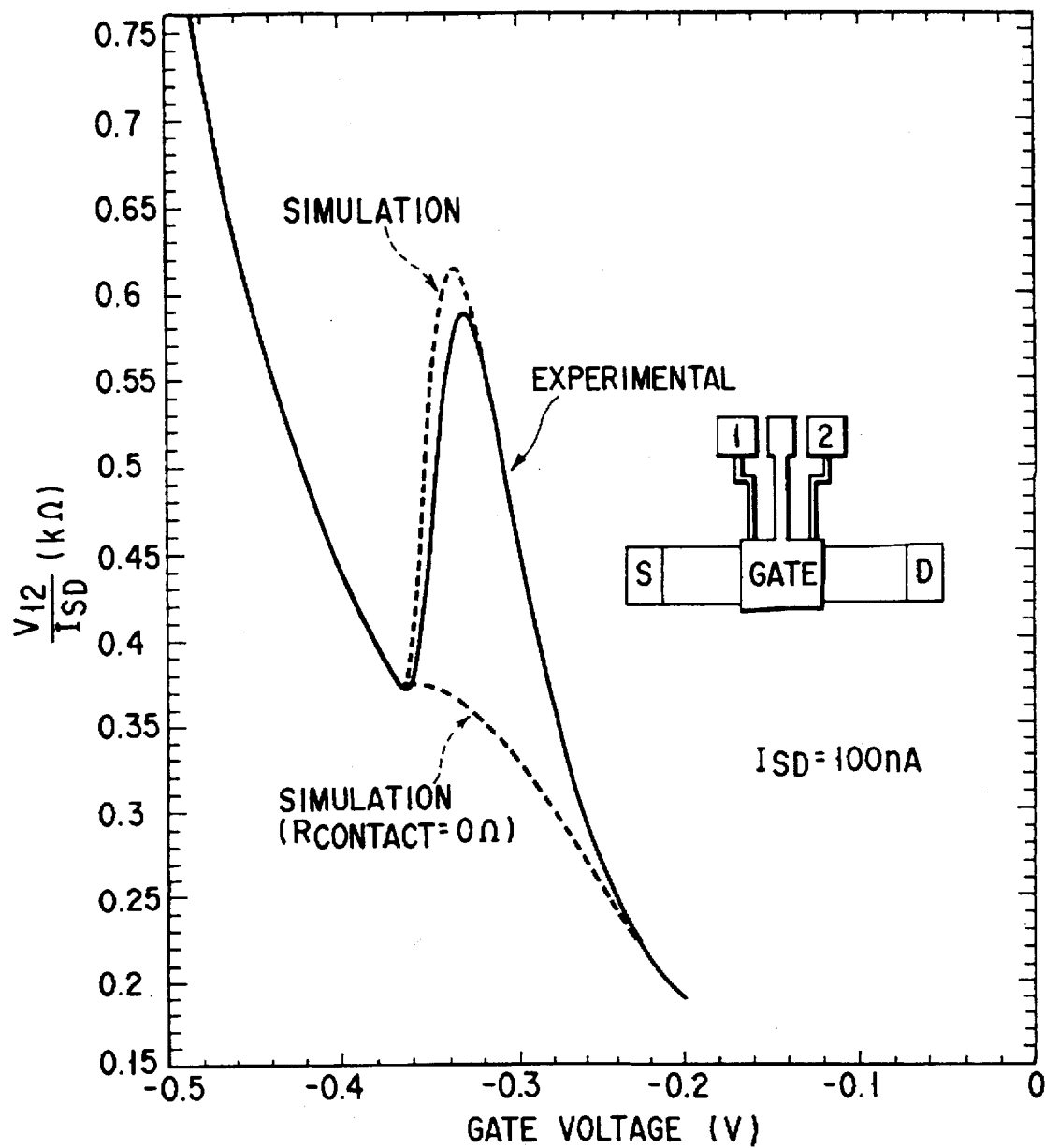
FIG. 3 shows the apparent resistance across the output electrodes of the device shown in FIGS. 1 and 2, as a function of gate voltage.

FIG. 3 shows, as a solid curve, how the apparent resistance across the probe-type ohmic contacts 15, 17 varies in practice as a function of gate voltage. Apparent resistance means the voltage measured between the probe-type ohmic contacts 15, 17 divided between the current flowing from source to drain. This is denoted in FIG. 3 as $V_{12}/I_{SD}$. Of course, if the probe-type ohmic contacts 15, 17 are used as output terminals to exploit the non-linearity characteristic, the source-drain current will no longer exactly equate to the current flowing in the 2DEGs, between the probe positions. Therefore, these contacts 15, 17, should be regarded as a high impedance output.

The broken line shows what would normally be expected for the change in apparent resistance as a function of gate voltage. As the gate voltage is gradually made more negative, the top 2DEG should progressively be depleted out. Then, as the gate voltage becomes still more negative, the bottom 2DEG should also progressively be depleted out (as shown from where the solid and broken lines merge), so that the apparent resistance increases still further.

The large region of negative transconductance found in the experimental case, obviously deviates markedly from the theoretical plot. Although not wishing to be bound by any particular theory or explanation for this behavior, the applicants have nevertheless deduced the following model. This model has been used to simulate the experimental curve shown by the dotted line in FIG. 3. It will be seen that it closely mirrors the experimental data.

Figure 4:
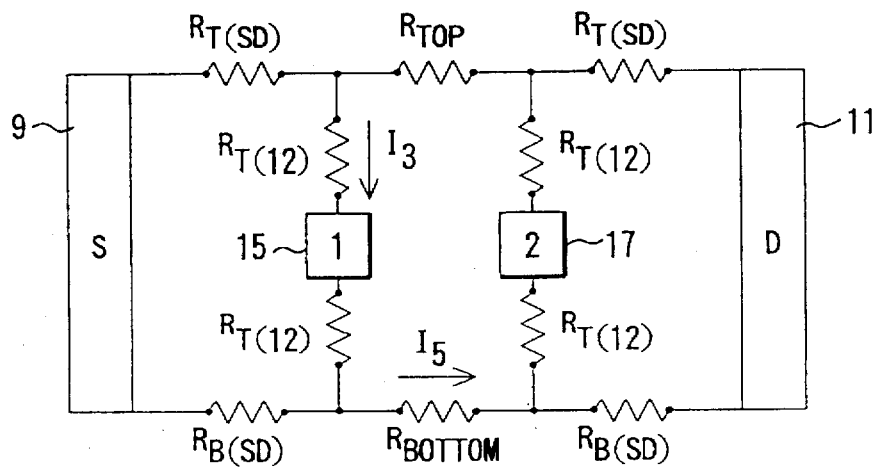
FIG. 4 is an equivalent circuit of the device shown in FIGS. 1 and 2, for the purpose of advancing an explanation of the operation thereof.

The model is based on the equivalent circuit shown in FIG. 4. The currents, resistances and contacts are those shown in FIG. 2. However, $R_{Bottom}$ is not shown in FIG. 2 but represents the resistance of the bottom 2DEG.

One can then apply Kirchoff's laws to the resistances in the equivalent circuit. Kirchoff's laws are: (i) the current into a junction equals the current out, and (ii) the resulting $E_{mf}$ about a closed loop is zero. The other resistances are derived directly from a consideration of the mesa layout. The measured four terminal (4T) voltage, $V_{12}$, may be expressed in terms of the resistances and the applied current. The resulting equations, equations A–C may be used to predict the behavior of the four terminal voltage as the contact resistance is increased.

$$R_T = \frac{2I_3 R_{B(12)} + I_5 R_{Bottom}}{I_{Constant}}$$

$$I_3 = \frac{-I_{Constant} R_{T(SD)} + I_5 R_{TBSD}}{R_{TB12} + R_{TBSD}}$$

$$I_{Constant} = \frac{R_{Top}(R_{TB12} + R_{TBSD}) + 2R_{T(SD)} R_{TB12}}{(R_{Top} + R_{Bottom})(R_{TB12} + R_{TBSD}) + 2R_{TB12} + R_{TBSD}}$$

where, $R_{TBSD} = R_{T(SD)} + R_{B(SD)}$ and $R_{TB12} = R_{T(12)} + R_{B(12)}$.

Such a calculation requires that the gate overlap onto the mesa probe arms be accounted for. Thus $R_{T(SD)}$ and $R_{T(12)}$ have a gate dependent component, this was chosen to be $R_{Top}/15$, the same as the experimental overlap. For simplicity both $R_{T(SD)}$ and $R_{T(12)}$ are chosen to be the same, that is $R_{T(SD)} = R_{T(12)} = R_{Contact} + R_{Top}/15$. The contact resistances for the bottom 2DEG are considered to have no gate component whilst the top layer is being depleted, thus $R_{B(SD)} = R_{B(12)} = R_{Contact}$.

Using this model, it has been ascertained that the experimental deviation from what would be expected in theory, is due to the probe-type ohmic contacts. Specifically, it can be considered to be the effect of current passing along the probe arms and through the shorting ohmic contacts. With small contact resistances, any additions to the measured four terminal potential are negligible. When these resistances become comparable to the 2DEG resistance then the voltage dropped across the contact resistances also becomes comparable. The measured resistance then tends towards a two-terminal value. Since there is a component of the contact resistance that is increasing with gate voltage (due to gate overlap), then the current through the contact vanishes as the upper 2DEG is depleted.

Thus the measured potential will tend towards the four terminal measurement of the lower 2DEG. The result is a peak in the voltage across the probe-type ohmic contacts that depends upon the relative sizes of the contact resistance ($R_{Contact}$) and the conducting layers resistance.

Thus the measured potential will tend towards the four terminal measurement of the lower 2DEG. The result is a peak in the voltage across the probe-type ohmic contacts that depends upon the relative sizes of the contact resistance ($R_{Contact}$) and the conducting layers resistance.

By using an optically defined mesa with long and narrow probe arms together with a frontgate (FIG. 3 inset), the simulation may be compared to the experimental measurement. The device is a GaAs/AlGaAs MBE grown structure as described previously. The upper 2DEG has a density of $0.7 \times 10^{15} m^2$ and a resistance of 380Ω whilst the lower 2DEG had $1.4 \times 10^{15} m^2$ carriers and a 390Ω resistance (the L/W ratio being 0.885). These values were obtained from four terminal magneto-transport measurements of the independently contacted 2DEGs. The independent contacts were also used to find the dependence of the resistance of the two 2DEGs upon the frontgate bias.

Extrapolation via the fitting of a non-linear function was required to extend the data near depletion as measurements are not possible in this highly resistive regime. By measuring the sizes of the gate overlap, the overlap component (as a percentage of the 2DEGs resistance $R_{Top}$) may be estimated. These overlaps being 20% for the source-drain (S-D) probe and 7% for the side probes. Further, by measuring the L/W ratios of the mesa arms then their resistance may be calculated, the S-D and side probes having ratios of 1.5 and 15 respectively. Given the above parameters the only remaining variables are the resistances of the ohmic contacts themselves. However, due to the geometry of the device these are expected to be small in comparison to the resistances of the 2DEGs in the probe arms. Thus a realistic value of 50Ω is arbitrarily chosen, since small changes in this value had no great effect upon the simulation result then such an assumption is justified.

In the light of this disclosure, modifications of the described embodiment, as well as other embodiments, all within the scope of the invention as defined by the appended claims, will now become apparent to persons skilled in the art.

What is claimed is:

1. A semiconductor device comprising a heterostructure which includes first and second mutually separated conductive layers; source and drain regions being provided, each contacting both of said first and second conductive layers; a gate electrode being disposed over the first and second conductive layers and between the source and drain regions; and first and second output contact regions being provided, each contacting both of said first and second conductive layers, the first and second output contact regions being positioned between the source and drain regions and each being overlapped by the gate electrode.

2. A method of operating a semiconductor device according to claim 1, the method comprising applying a first voltage between the source and drain regions, applying a second variable voltage to the gate electrode and obtaining an output voltage across said first and second output contact regions.

3. A device according to claim 1, wherein the gate electrode is positioned directly between the source and drain regions, and respective contact electrodes for the first and second output contact regions are positioned beside the path between the source region, gate electrode and drain region.

4. A method of operating a semiconductor device according to claim 3, the method comprising applying a first voltage between the source and drain regions, applying a second variable voltage to the gate electrode and obtaining an output voltage across said first and second output contact regions.

5. A device according to claim 3, further comprising a barrier layer disposed between the first and second conductive layers.

6. A method of operating a semiconductor device according to claim 5, the method comprising applying a first voltage between the source and drain regions, applying a second variable voltage to the gate electrode and obtaining an output voltage across said first and second output contact regions.

7. A device according to claim 5, further comprising a doped layer disposed above an upper one of said conductive layers and/or below a lower one of said conductive layers.

8. A method of operating a semiconductor device according to claim 7, the method comprising applying a first voltage between the source and drain regions, applying a second variable voltage to the gate electrode and obtaining an output voltage across said first and second output contact regions.

9. A device according to claim 3, further comprising a doped layer disposed above an upper one of said conductive layers and/or below a lower one of said conductive layers.

10. A method of operating a semiconductor device according to claim 9, the method comprising applying a first voltage between the source and drain regions, applying a second variable voltage to the gate electrode and obtaining an output voltage across said first and second output contact regions.

11. A device according to claim 1, further comprising a barrier layer disposed between the first and second conductive layers.

12. A method of operating a semiconductor device according to claim 11, the method comprising applying a first voltage between the source and drain regions, applying a second variable voltage to the gate electrode and obtaining an output voltage across said first and second output contact regions.

13. A device according to claim 11, further comprising a doped layer disposed above an upper one of said conductive layers and/or below a lower one of said conductive layers.

14. A method of operating a semiconductor device according to claim 13, the method comprising applying a first voltage between the source and drain regions, applying a second variable voltage to the gate electrode and obtaining an output voltage across said first and second output contact regions.

15. A device according to claim 1, further comprising a doped layer disposed above an upper one of said conductive layers and/or below a lower one of said conductive layers.

16. A method of operating a semiconductor device according to claim 15, the method comprising applying a first voltage between the source and drain regions, applying a second variable voltage to the gate electrode and obtaining an output voltage across said first and second output contact regions.

17. A device according to claim 1, in which each of the first and second conductive layers is an active layer in which a two-dimensional electron gas can be induced.

18. A method of operating a semiconductor device according to claim 17 the method comprising applying a first voltage between the source and drain regions, applying a second variable voltage to the gate electrode and obtaining an output voltage across said first and second output contact regions.

19. A device according to claim 17 wherein the gate electrode is positioned directly between the source and drain regions and respective contact electrodes for the first and second output contact regions are positioned beside the path between the source region, gate electrode and drain region.

20. A method of operating a semiconductor device according to claim 19, the method comprising applying a first voltage between the source and drain regions, applying a second variable voltage to the gate electrode and obtaining an output voltage across said first and second output contact regions.

21. A device according to claim 19, further comprising a barrier layer disposed between the first and second conductive layers.

22. A method of operating a semiconductor device according to claim 21, the method comprising applying a first voltage between the source and drain regions, applying a second variable voltage to the gate electrode and obtaining an output voltage across said first and second output contact regions.

23. A device according to claim 21, further comprising a doped layer disposed above an upper one of said conductive layers and/or below a lower one of said conductive layers.

24. A method of operating a semiconductor device according to claim 23, the method comprising applying a first voltage between the source and drain regions, applying a second variable voltage to the gate electrode and obtaining an output voltage across said first and second output contact regions.

25. A device according to claim 19, further comprising a doped layer disposed above an upper one of said conductive layers and/or below a lower one of said conductive layers.

26. A method of operating a semiconductor device according to claim 25, the method comprising applying a first voltage between the source and drain regions, applying a second variable voltage to the gate electrode and obtaining an output voltage across said first and second output contact regions.

27. A device according to claim 17 further comprising a barrier layer disposed between the first and second conductive layers.

28. A method of operating a semiconductor device according to claim 27, the method comprising applying a first voltage between the source and drain regions, applying a second variable voltage to the gate electrode and obtaining an output voltage across said first and second output contact regions.

29. A device according to claim 27, further comprising a doped layer disposed above an upper one of said conductive layers and/or below a lower one of said conductive layers.

30. A method of operating a semiconductor device according to claim 29, the method comprising applying a first voltage between the source and drain regions, applying a second variable voltage to the gate electrode and obtaining an output voltage across said first and second output contact regions.

31. A device according to claim 17 further comprising a doped layer disposed above an upper one of said conductive layers and/or below a lower one of said conductive layers.

32. A method of operating a semiconductor device according to claim 31, the method comprising applying a first voltage between the source and drain regions, applying a second variable voltage to the gate electrode and obtaining an output voltage across said first and second output contact regions.

* * * * *